United States Patent [19]

Merrem et al.

[11] Patent Number: 4,765,844
[45] Date of Patent: Aug. 23, 1988

[54] SOLVENTS FOR PHOTORESIST REMOVAL

[75] Inventors: Hans-Joachim Merrem, Seeheim-Jugenheim; Axel Schmitt, Walluf, both of Fed. Rep. of Germany

[73] Assignee: Hoechst Aktiengesellschaft, Frankfurt am Main, Fed. Rep. of Germany

[21] Appl. No.: 920,665

[22] Filed: Oct. 20, 1986

[30] Foreign Application Priority Data

Oct. 22, 1985 [DE] Fed. Rep. of Germany ....... 3537441

[51] Int. Cl.$^4$ .................... C11D 7/32; C09D 9/04; C23D 17/00
[52] U.S. Cl. ..................... 134/38; 252/153; 252/364; 252/DIG. 8; 430/329
[58] Field of Search .............. 134/38; 252/DIG. 8, 252/364, 153; 430/313, 329, 331

[56] References Cited

U.S. PATENT DOCUMENTS

| | | | |
|---|---|---|---|
| 3,673,099 | 6/1972 | Corby et al. | 252/156 |
| 3,796,602 | 3/1974 | Briney et al. | 134/38 |
| 4,077,896 | 3/1978 | Bunegar et al. | 252/90 |
| 4,592,787 | 6/1986 | Johnson | 134/38 |
| 4,617,251 | 10/1986 | Sizensky | 430/256 |

FOREIGN PATENT DOCUMENTS 0075329  3/1983  European Pat. Off.
0145973  6/1985  European Pat. Off.

OTHER PUBLICATIONS

W. S. De Forest (Photoresist: Materials and Processes, pp. 203–207, McGraw-Hill Book Co., 1975.
Patent Abstracts of Japan, Band 7, Nr. 6 (P-167[1151], 11 Jan. 1983; and JP-A-57 165 834 (Hitachi Kasei Kogyo K.K.) 13-10-1982.
Patent Abstracts of Japan, Band 7, Nr. 54 (P-180) [1199], 4 Mar. 1983; and JP-A-57 202 540 (Mitsuwaka Jiyunyaku Kenkyusho K.K.) 11-12-1982.

Primary Examiner—Dennis Albrecht
Assistant Examiner—Kathleen Markowski
Attorney, Agent, or Firm—Foley & Lardner, Schwartz, Jeffery, Schwaab, Mack, Blumenthal & Evans

[57] ABSTRACT

The invention relates to solvent systems which are based on water-soluble amino derivatives and propylene glycol components, for removing photoresists. These solvent systems are comprised of (a) from about 10 to 100% by weight of at least one water-soluble amine of the general formula

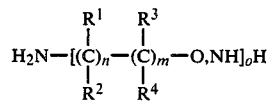

in which
$R^1$, $R^2$, $R^3$, $R^4$ denote H or alkyl groups
n,m denote 0 to 2, and
o denotes 1 to 3; and (b) from about 0 to 90% by weight of at least one water-soluble propylene glycol derivative of the general formula

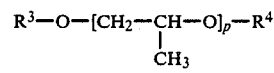

in which
$R^3$, $R^4$ denote H, alkyl or

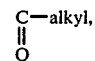

and
P denotes 1 to 3.

11 Claims, No Drawings

SOLVENTS FOR PHOTORESIST REMOVAL

BACKGROUND OF THE INVENTION

The present invention relates to novel solvent systems, based on water-soluble amino derivatives and propylene glycol compounds, that are useful for removing photoresists.

Photoresists are used as masks in the production of, via etching or implantation processes, integrated component parts, circuit boards, and the like. After having served their purposes, the masks are generally removed, frequently by means of agents which, depending on their mode of action, are known as "strippers" or "removers".

Systems of this kind are described, for example, by W. S. de Forest in "Photoresist: Materials and Processes" pages 203 et seq., McGraw-Hill Book Co., New York, 1975. They contain, e.g., chlorinated hydrocarbons, such as methylenechloride; polar solvents, such as dimethylformamide, N-methyl-2-pyrrolidone and monoethanolamine; glycol ethers, such as ethylene glycol monoethyl ether, ethylene glycol monobutyl ether and the acetates thereof; strong bases, such as tetramethyl ammonium hydroxide; and strong acids, such as sulfuric acid/$H_2O_2$ mixtures.

U.S. Pat. No. 3,673,099 describes a mixture of N-methyl-2-pyrrolidone and a strong base, such as tetramethyl ammonium hydroxide. It is known that mixtures of this type attack sensitive substrates, such as aluminum layers, when water is added. It is, however, desirable for a product to be suitable for removing photoresist coatings both from sensitive and less sensitive substrate layers, since quite frequently these two types of substrate layers are used simultaneously. Moreover, tetramethyl ammonium hydroxide easily decomposes when heated, and thus the stripping solution has a very short service life at elevated temperatures.

U.S. Pat. No. 3,796,602 describes a system comprising an organic solvent which is partially miscible with water. However, the compounds mentioned in this publication, such as ethylene glycol monobutyl ether and monoaminoethanol, present toxicological problems. Furthermore, these compounds evaporate easily due to their low boiling points and, hence, cannot be employed at elevated temperatures.

European Patent Application No. 0 075 329 describes a mixture of a derivative of 2-pyrrolidone and a diethylene glycol monoalkyl ether. Compounds of this kind are, however, hardly effective in their action. In the examples of the document, for instance, a stripper bath temperature of 75° C. is required for removal of a photoresist subjected to a post-bake treatment at about 150° C.

European Patent Application No. 0 145 973 describes a system of a piperazine derivative and a N-alkyl-2-pyrrolidone. The preferably employed N-aminoethyl piperazine is classified as being toxic, whereas n-hydroxyethyl piperazine is scarcely effective.

SUMMARY OF THE INVENTION

It is therefore an object of the present invention to provide an agent for photoresist removal that can be used at low temperatures and at elevated temperatures, that does not cause toxic problems, that can be rinsed off with water and is completely, or at least largely, non-corrosive of sensitive substrates.

In accomplishing the foregoing object, there has been provided, in accordance with one aspect of the present invention, an agent for photoresist removal that is comprised of:

(a) 10 to 100% by weight of at least one water-soluble amine represented by the formula

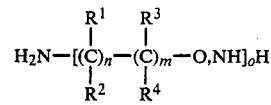

in which
$R^1$, $R^2$, $R^3$, $R^4$ denote H or alkyl groups
n, m denote 0 to 2, and
o denotes 1 to 3;
and (b) 0 to 90% by weight of at least one water-soluble propylene glycol derivative represented by the formula

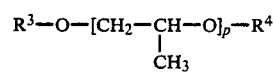

in which
$R^3$, $R^4$ denote H, alkyl or

groups, and
P denotes 1 to 3.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The solvent systems of the present invention are suitable for removing both positive-working resists and photopolymerizable resists. Resists can be developed with aqueous-alkaline solutions are preferably removed.

It has been found that mixtures made according to the instant invention, comprising water-soluble propylene glycol ethers and amino compounds, can be used as agents for photoresist removal, and do not exhibit the disadvantages of the prior art cited above. Preference is given to mixtures which, due to the high boiling temperatures (at least 180° C.) of the individual components, result in only slight weight losses when the agent is used at elevated temperatures over a prolonged period of time. A mixture of N-(2-amino-ethyl)ethanolamine and tripropylene glycol methyl ether is particularly preferred.

It was not foreseeable that the photoresist remover of the present invention, comprising high-boiling propylene glycol ether derivatives such as tripropylene glycol methyl ether, would exhibit satisfactory properties even at room temperature. Thus, it is possible to use the remover of the present invention to particular advantage for the purpose of the invention, since it can be employed effectively at room temperature and, due to its favorable evaporation characteristics, at elevated bath temperatures as well.

It has also been found that the particularly preferred mixture of tripropylene glycol methyl ether and N-(2-aminoethyl)-ethanolamine has a synergetic effect.

Since, in practice, photoresist layers which were not exposed to high temperatures have to be removed quite frequently, mixtures whose individual components have boiling points of 160° C. or higher are also preferable. Of these, mixtures of dipropylene glycol methyl ether and isopropanolamine are particularly preferred. These systems, too, exhibit the advantages described above, i.e., they can be used at room temperature and at elevated temperatures. Due to their higher evaporation rates, however, these removers are preferably employed at relatively low bath temperatures, and they have a synergetic effect.

It is true that the propylene glycol ethers, such as dipropylene glycol methyl ether or tripropylene glycol methyl ether which are preferably employed within this invention, are distinctly more hydrophobic than comparable ethylene glycol ether products, and hence they possess good solubilizing properties with respect to organic polymers. Nevertheless, the compounds used in the present invention can be easily rinsed off with water without leaving any residues.

Despite their high efficiency, the mixtures according to the present invention do not corrode sensitive substrates, such as aluminum layers.

Mixtures containing 10 to 90% by weight, and in particular 20 to 70% by weight, of the amine and 10 to 90% by weight, and in particular 30 to 80% by weight, of the propylene glycol derivative, are preferred. It is particularly preferred that these ratios be employed with isopropanolamine and/or N-(2-amino-ethyl)ethanolamine and di- or tripropylene glycol methyl ether.

Apart from their low toxicity, the mentioned systems exhibit the advantages of having only a very faint odor, so that it is, for example, also possible to use them in uncovered baths.

It is self-evident that mixtures of one or several amines with one or several propylene glycol derivatives also come within the scope of the present invention.

Although it is customary to remove photoresists in an immersion process, whereby the substrates carrying photoresist coatings are usually moved in a bath or, alternatively, the bath is moved, for example, by means of a circulation pump, the remover solutions of the present invention are also suitable for use in other processes, such as spray or puddle processes.

The present invention will now be explained in greater detail by references to the following, non-limiting examples.

EXAMPLES 1 TO 5

To test the effectiveness of the remover, photoresist coatings conventionally employed in the production of integrated circuits were used. A commercially available photoresist on a diazoquinone/novolak basis (AZ 1350 J) was spin-coated onto silicon wafers at 4,000 rpm and dried at 90° C. for 30 minutes. A coating thickness of 1.8 $\mu$m was measured. Subsequently, the substrates were baked at 200° C. for 30 minutes.

The removal tests were performed in a moving bath having a temperature of 80° C. After a dwell time of 10 minutes in the bath, the wafers were rinsed with deionized water and the remaining thickness of the resist coating was measured. The results, which are compiled in Table 1, clearly show the superior effectiveness of N-(2-aminoethyl)-ethanolamine (AEEA) and isopropanolamine (IPA), which were employed in accordance with the invention. Triethylene-tetraamine also had a good removing action, but because of its toxicity this compound is not preferred.

The amines used for comparative tests were added in equimolar amounts.

EXAMPLES 6 TO 12

The following examples also served to test the effectiveness of various amino compounds. Here, too, the compositions were mixed such that equimolar amounts were present in each case.

The test conditions were the same as in Examples 1 to 5, except that the substrates had been baked at 160° C. for 30 minutes. The bath temperature was 22° C., and the dwell time in the remover bath was 10 minutes. Again, the thickness of the resist coating was measured.

The results shown in Table 2 indicate that even at 22° C. the removing action of N-(2-amino-ethyl)-ethanolamine and triethylenetetraamine is superior. Whereas in this case the combination of isopropanolamine and tripropylene glycol methyl ether (TPM) is considered less preferable, the mixture of isopropanolamine and dipropylene glycol methyl ether exhibited good properties at room temperature.

EXAMPLES 13 TO 18

As described in Examples 1 to 5, various mixtures of N-(2-aminoethyl)-ethanolamine and tripropylene glycol methyl ether were tested. The substrates had been baked at 200° C. for 30 minutes, and the baths had a temperature of 80° C.

The results achieved with a bath dwell time of 4 minutes are compiled in Table 3. Under these conditions, the photoresist coatings were not yet removed completely, but the synergetic effect between N-(2-aminoethyl)-ethanolamine and tripropylene glycol methyl ether was impressively demonstrated by the measurement of the resist thicknesses of incompletely removed photoresist portions. A mixture comprised of 51% by weight of N-(2-aminoethyl)ethanolamine and 49% by weight of tripropylene glycol methyl ether was found to be the optimum composition.

EXAMPLES 19 TO 21

As described in Examples 13 to 18, the synergetic effect between isopropanolamine and depropylene glycol methyl ether (DPM) was determined. In these examples, too, the dwell time in the remover bath had been chosen such that measurable resist coatings remained on the substrate.

The results compiled in Table 4 show that an optimum effectiveness is achieved when the mixture is comprised of 22.5% by weight of isopropanolamine and 77.5% by weight of dipropylene glycol methyl ether.

EXAMPLES 22 AND 23

In these examples, the behavior of the removers towards aluminum layers was tested by heating the compositions corresponding to Examples 13 and 19 to a temperature of 80° C. and allowing them to act on aluminum-coated wafers for 30 minutes. No attack of the aluminun layer was observed.

TABLE 1

| Example No. | Composition* | Thickness of resist coating |
|---|---|---|
| 1 | 64.4% Di-(n-propylene)-triamine<br>35.6% Tripropylene-glycol-methyl ether (TPM) | 0.380 μm |
| 2 | 50.7% Diethylene-triamine<br>49.3% TPM | 0.249 μm |
| 3 | 71.8% Triethylene-tetraamine<br>28.2% TPM | 0 μm |
| 4 | 36.9% Isopropanolamine (IPA)<br>63.1% TPM | 0 μm |
| 5 | 51.0% N—(2-aminoethyl)-ethanol amine (AEEA)<br>49.0% TPM | 0 μm |

*Percentages expressed by weight

TABLE 2

| Example No. | Composition* | Thickness of resist coating |
|---|---|---|
| 6 | 63.9% Hydroxyethyl piperazine<br>36.1% TPM | 1.517 μm |
| 7 | 51.6% Aminoethoxyethanol<br>48.4% TPM | 0.396 μm |
| 8 | 50.7% Diethylene triamine<br>49.3% TPM | 0.369 μm |
| 9 | 36.9% IPA<br>63.1% TPM | 0.293 μm |
| 10 | 71.8% Triethylene tetramine<br>28.2% TPM | 0 μm |
| 11 | 51.0% AEEA<br>49.0% TPM | 0 μm |
| 12 | 36.9% IPA<br>63.1% Dipropylene glycol methyl ether (DPM) | 0 μm |

*Percentages expressed by weight

TABLE 3

| Example No. | Composition* | Thickness of resist coating |
|---|---|---|
| 13 | 75% N—(2-aminoethyl)-ethanol amine (AEEA)<br>25% Tripropylene-glycol-methyl ether (TPM) | 0.652 μm |
| 14 | 51% AEEA<br>49% TPM | 0.387 μm |
| 15 | 35% AEEA<br>65% TPM | 0.758 μm |
| 16 | 25% AEEA<br>75% TPM | 0.860 μm |
| 17 | 15% AEEA<br>85% TPM | 0.896 μm |
| 18 | 10% AEEA<br>90% TPM | 1.174 μm |

*Percentages expressed by weight

TABLE 4

| Example No. | Composition | Thickness of resist coating |
|---|---|---|
| 19 | 10.0% IPA<br>90.0% DPM | 1.22 μm |
| 20 | 22.5% IPA<br>77.5% DPM | 0.50 μm |
| 21 | 36.9% IPA<br>63.1% DPM | 0.83 μm |

*Percentages expressed by weight

EXAMPLES 24 TO 27

To test the effectiveness of removers of the present invention, photopolymerizable photoresists were used that are developable by means of aqueous-alkaline developers and are customarily employed in the production of circuit boards. A commercially available dry resist (Ozatec® T 138, made by Hoechst AG) was bonded to a copper-clad laminate board at 115° C., exposed for 8 seconds to a 5 kw metal halide lamp arranged at a distance of 60 cm, and developed in a 1% strength aqueous Na$_2$CO$_3$ solution having a temperature of 30° C. for 70 seconds.

The removal tests were performed in a moving bath having a temperature of 50° C. After 10 minutes, the results compiled in Table 5 were achieved. The resists were removed both by undiluted removal agents and by agents that had been diluted with water.

TABLE 5

| Example No. | Composition | Resist removed |
|---|---|---|
| 24 | 51% AEEA<br>49% TPM | yes |
| 25 | 12.75% AEEA<br>12.25% TPM<br>75% water | yes |
| 26 | 22.5% IPA<br>77.5% DPM | yes |
| 27 | 5.63% IPA<br>19.37% DPM<br>75% water | yes |

What is claimed is:

1. An agent for the removal of photoresists consisting essentially of
(a) from about 10 to 90% by weight of at least one water-soluble amine represented by the formula

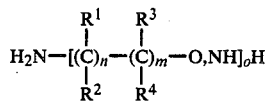

in which
R$^1$, R$^2$, R$^3$, R$^4$ denote H or alkyl groups
n, m denote 0 to 2, and
o denotes 1 to 3;
and
(b) from about 10 to 90% by weight of at least one water-soluble propylene glycol derivative represented by the formula

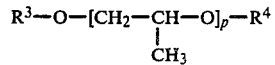

in which
R$^3$, R$^4$ denote H, alkyl or

groups, and
P denotes 1 to 3; wherein said agent is biodegradable, of low toxicity, free of ammonium hydroxide base, relatively non corrosive to aluminum and wherein substantially all components of said agent boil at temperatures of at least 160° C.

2. An agent as claimed in claim 1, wherein said water-soluble amine is selected from the group consisting of isopropanolamine and N-(2-aminoethyl)-ethanolamine.

3. An agent as claimed in claim 1, wherein said water-soluble propylene glycol derivative is selected from the group consisting of dipropylene glycol methyl ether and tripropylene glycol methyl ether.

4. An agent as claimed in claim 1, wherein said agent consists essentially of a water-soluble amine in an amount from about 20–70% by weight, and a water-soluble propylene glycol derivative in an amount from about 30 to 80% by weight.

5. An agent as claimed in claim 1, wherein the boiling points of said water-soluble amine and said water-soluble propylene glycol derivative are at least 160° C.

6. An agent as claimed in claim 1, wherein the boiling points of said water-soluble amine and said water-soluble propylene glycol derivative are at least 180° C.

7. An agent as claimed in claim 2, wherein said water-soluble propylene glycol derivative is selected from the group consisting of dipropylene glycol methyl ether and tripropylene glycol methyl ether.

8. An agent as claimed in claim 1 consisting essentially of tripropylene glycol methyl ether and N-(2-aminoethyl)-ethanolamine.

9. An agent as claimed in claim 4 consisting essentially of tripropylene glycol methyl ether and N-(2-aminoethyl)-ethanolamine.

10. An agent as claimed in claim 1 consisting essentially of approximately equimolar amounts of said amine and said glycol derivative.

11. An agent as claimed in claim 10 consisting essentially of approximately equimolar amounts of tripropylene glycol methyl ether and N-(2-aminoethyl)-ethanolamine.

* * * * *